US009053986B2

(12) United States Patent
Ahn et al.

(10) Patent No.: US 9,053,986 B2

(45) Date of Patent: Jun. 9, 2015

(54) SEMICONDUCTOR DEVICE AND FLAT PANEL DISPLAY INCLUDING THE SAME

(75) Inventors: Jeong-Keun Ahn, Yongin (KR); Wang-Jo Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 16 days.

(21) Appl. No.: 13/528,976

(22) Filed: Jun. 21, 2012

(65) Prior Publication Data

US 2013/0193439 A1 Aug. 1, 2013

(30) Foreign Application Priority Data

Feb. 1, 2012 (KR) ........................ 10-2012-0010388

(51) Int. Cl.

*H01L 29/12* (2006.01)
*H01L 27/12* (2006.01)

(52) U.S. Cl.

CPC .................................. *H01L 27/1255* (2013.01)

(58) Field of Classification Search

CPC ........................ H01L 27/1255; H01L 27/2653
USPC .......... 257/59, 72, 66, 71, E29.117, 288, 290, 257/365, 368, 371, 401
See application file for complete search history.

(56) References Cited

U.S. PATENT DOCUMENTS 5,717,224 A 2/1998 Zhang
6,495,858 B1 * 12/2002 Zhang ............................ 257/59
6,979,956 B2 * 12/2005 Park et al. .................. 315/169.3
7,227,184 B2 * 6/2007 Park et al. ....................... 257/59
2002/0197778 A1 12/2002 Kasahara et al.
2003/0141811 A1 7/2003 Park et al.
2007/0229408 A1 * 10/2007 Primerano ...................... 345/76
2011/0006306 A1 1/2011 Yamazaki et al.
2011/0128211 A1 6/2011 Ono

FOREIGN PATENT DOCUMENTS

EP 1052700 A1 11/2000
JP 04-366924 A 12/1992
JP 10-078590 A 3/1998
KR 10-2003-0069347 A 8/2003
KR 10-2005-0086073 A 8/2005

OTHER PUBLICATIONS

European Search Report dated May 24, 2013.

* cited by examiner

*Primary Examiner* — Jose R Diaz

(74) *Attorney, Agent, or Firm* — Lee & Morse, P.C.

(57) ABSTRACT

A semiconductor device includes a semiconductor layer on a substrate, a gate electrode electrically insulated from the semiconductor layer by a gate insulating layer, an insulating layer on the gate insulating layer and on the gate electrode, and a source electrode and a drain electrode on the insulating layer, the source and drain electrode being connected to the semiconductor layer. The source electrode overlaps at least a part of the gate electrode. The source electrode, the insulating layer, and the gate electrode overlap each other so as to provide a capacitor.

7 Claims, 4 Drawing Sheets

86
84
82
80
LED
70
60a
60b
50a
50
30
Cst
10
T
40
20
50a
42
62a
22
62b

SEMICONDUCTOR DEVICE AND FLAT PANEL DISPLAY INCLUDING THE SAME

CROSS-REFERENCE TO RELATED APPLICATION

This application claims priority to and the benefit of Korean Patent Application No. 10-2012-0010388, filed on Feb. 1, 2012, in the Korean Intellectual Property Office, the entire content of which is incorporated herein by reference.

BACKGROUND

1. Field

Embodiments relate to a semiconductor device and a flat panel display (FPD) including the same, and more particularly, to a semiconductor device including a thin film transistor (TFT) and a capacitor and a flat panel display including the same.

2. Description of the Related Art

A typical semiconductor device may include a thin film transistor and a capacitor. The TFT includes a semiconductor layer for providing a channel region and source and drain regions, a gate electrode provided on the semiconductor layer of the channel region and electrically insulated from the semiconductor layer by a gate insulating layer, and source and drain electrodes connected to the semiconductor layer of the source and drain regions. The capacitor may include two electrodes and a dielectric layer interposed between the two electrodes.

SUMMARY

According to an embodiment, there is provided a semiconductor device including a semiconductor layer on a substrate, a gate electrode electrically insulated from the semiconductor layer by a gate insulating layer, an insulating layer on the gate insulating layer and on the gate electrode, and a source electrode and a drain electrode on the insulating layer, the source and drain electrode being connected to the semiconductor layer and the source electrode overlapping at least a part of the gate electrode. The source electrode, the insulating layer, and the gate electrode may overlap each other so as to provide a capacitor.

The insulating layer may include contact holes that expose the semiconductor layer. The source and drain electrodes may be connected to the semiconductor layer through the contact holes.

According to an embodiment, there is provided a flat panel display (FPD) including a first thin film transistor (TFT) connected to a scan line and a data line, a second TFT connected to the first TFT, and a light emitting element connected to the second TFT. The second TFT includes a semiconductor layer on a substrate, a gate electrode electrically insulated from the semiconductor layer by a gate insulating layer, an insulating layer on the gate insulating layer and on the gate electrode, and a source electrode and a drain electrode on the insulating layer, the source electrode and the drain electrode being connected to the semiconductor layer, and the source electrode overlapping at least a part of the gate electrode. The source electrode, the insulating layer, and the gate electrode may overlap each other so as to provide a capacitor integrated with the second TFT.

The insulating layer includes contact holes that expose the semiconductor layer. The source and drain electrodes may be connected to the semiconductor layer through the contact holes.

The source electrode of the second TFT may be connected to a power source voltage. The drain electrode of the second TFT may be connected to the light emitting element.

The light emitting element may include an anode electrode, an organic light emitting layer, and a cathode electrode. The anode electrode may be connected to the drain electrode of the second TFT.

BRIEF DESCRIPTION OF THE DRAWINGS

The accompanying drawings, together with the specification, illustrate exemplary embodiments, and, together with the description, serve to explain exemplary embodiments.

DETAILED DESCRIPTION

Korean Patent Application No. 10-2012-0010388, filed on Feb. 1, 2012, in the Korean Intellectual Property Office, and entitled: "Semiconductor device and flat panel display device having the same" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

Figure 1:
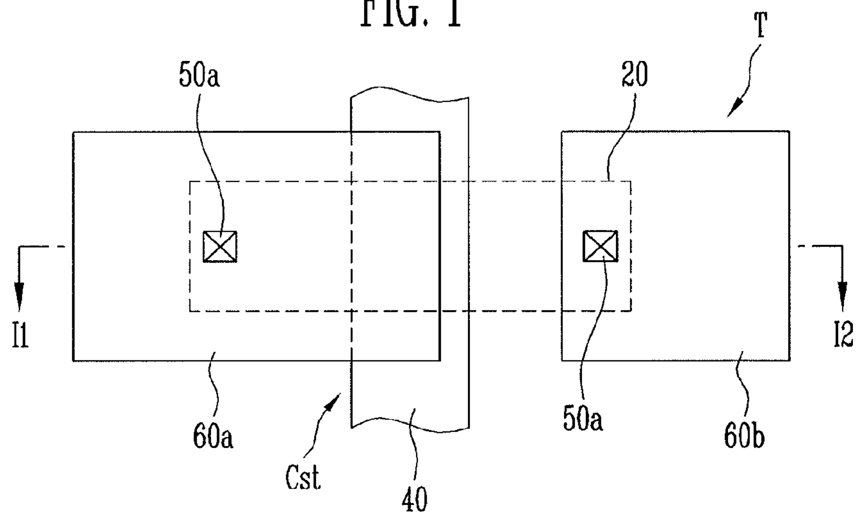
FIG. 1 is a layout diagram illustrating a semiconductor device according to an embodiment.

FIG. 1 is a layout diagram illustrating a semiconductor device according to an embodiment.

In the semiconductor device according to the embodiment, a thin film transistor (TFT) T and a capacitor Cst are integrated with each other. The TFT T may include a semiconductor layer 20, a gate electrode 40 provided on the channel region of the semiconductor layer 20, and a source electrode 60*a* and a drain electrode 60*b* connected to the source region and the drain region of the semiconductor layer 20. The capacitor Cst includes the gate electrode 40 and the source electrode 60*a* or the drain electrode 60*b* arranged to overlap each other.

Figure 2:
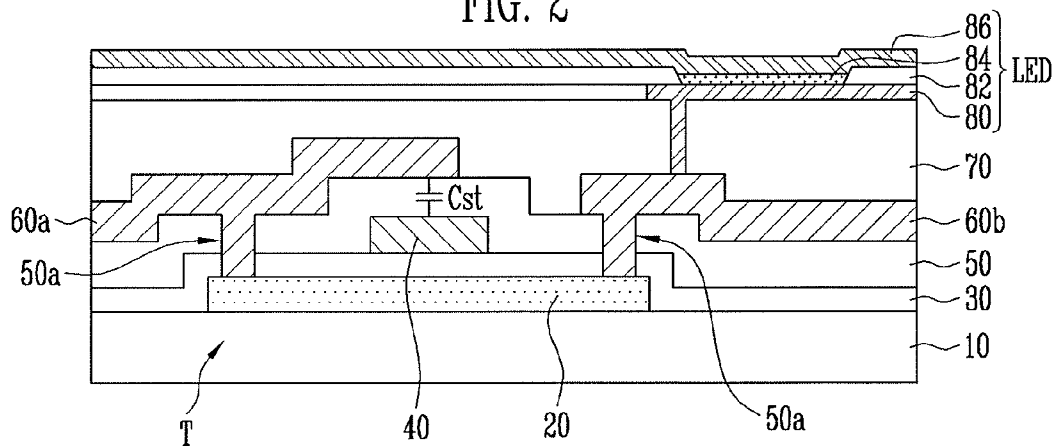
FIG. 2 is a sectional view illustrating the embodiment of the semiconductor device and a flat panel display (FPD).

FIG. 2 is a sectional view taken along the line 11-12 of FIG. 1. The semiconductor device according to the embodiment will be described in detail as follows.

Referring to FIGS. 1 and 2, the semiconductor layer 20 is formed on a substrate 10 and a gate insulating layer 30 is formed on the substrate 10 including the semiconductor layer 20.

The substrate 10 may be formed of a semiconductor such as silicon (Si) or germanium (Ge), an insulator such as glass and plastic, or a metal thin film. The semiconductor layer 20 may be formed of amorphous silicon, crystalline silicon, or a compound semiconductor. The gate insulating layer 30 may be formed of a silicon oxide, a silicon nitride, or a compound or a laminated structure of the silicon oxide and the silicon nitride. In addition, before the semiconductor layer 20 is formed, a buffer layer (not shown) may be formed on the substrate 10.

The gate electrode 40 is formed on the gate insulating layer 30 on the semiconductor layer 20. An interlayer insulating layer 50 is formed on the gate insulating layer 30 including the gate electrode 40.

The gate electrode 40 may be formed of a metal or a doped semiconductor. The interlayer insulating layer 50 may be formed of a silicon oxide, a silicon nitride, a metal oxide, or a compound or a laminated structure of the silicon oxide, the silicon nitride, and/or the metal oxide.

The source and drain electrodes 60*a* and 60*b* are formed on the interlayer insulating layer 50 to be electrically connected to the semiconductor layer 20. The source and drain electrodes 60*a* and 60*b* are connected to the semiconductor layer 20 exposed through contact holes 50*a* formed in the interlayer insulating layer 40 and the gate insulating layer 30.

One of the source and drain electrodes 60*a* and 60*b*, for example, the source electrode 60*a* extends above the gate electrode 40 to overlap at least a part of the gate electrode 40 so that the capacitor Cst is formed by the source electrode 60*a*, the interlayer insulating layer 50, and the gate electrode 40 arranged to overlap each other. Thus, the gate electrode 40 is used as one electrode of the capacitor Cst, a part of the source electrode 60*a* extended above the gate electrode 40 is used as the other electrode of the capacitor Cst, and the interlayer insulating layer 50 between the gate electrode 40 and the source electrode 60*a* that overlap each other is used as the dielectric substance of the capacitor Cst.

In FIGS. 1 and 2, the source electrode 60*a* extends above the gate electrode 40 to overlap a part of the gate electrode 40. However, the degree to which the source electrode 60*a* overlaps the part of the gate electrode 40 may be determined in consideration of desired electrostatic capacitance and the distance between the gate electrode 40 and the drain electrode 60*b*. In order to secure the maximum electrostatic capacitance, the source electrode 60*a* may be formed to overlap the entire gate electrode 40.

The semiconductor device according to the present embodiment having the above structure may be applied to, for example, the pixel circuit of a flat panel display (FPD).

Figure 3:
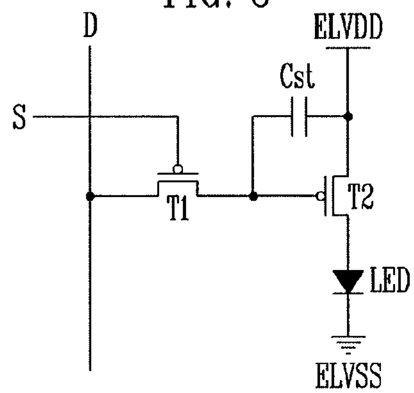
FIG. 3 is a circuit diagram illustrating an embodiment of the FPD.

FIG. 3 is a circuit diagram illustrating an embodiment of the pixel circuit of the FPD. The pixel circuit including two TFTs T1 and T2, one storage capacitor Cst, and a light emitting diode (LED) will be taken as an example. A liquid crystal display (LCD) and an organic light emitting display may be applied as the FPD.

The first TFT T1 operates as a switching element connected to a scan line S and a data line D to transmit a data signal in accordance with a scan signal. Therefore, the first TFT T1 receives the scan signal through the gate electrode and receives the data signal through the source electrode.

The second TFT T2 operates as a driving element connected between a power source voltage ELVDD and the LED to drive the LED in accordance with the data signal. In addition, the storage capacitor Cst provides electrostatic capacitance that maintains the voltage corresponding to the data signal for a uniform period of time. Therefore, the gate electrode is connected to the drain electrode of the first TFT T1 to receive the power source voltage ELVDD through the source electrode and the drain electrode is connected to the LED.

Referring to FIG. 2, when the semiconductor device according to the present embodiment is applied to the organic light emitting display, the LED may be formed of an organic light emitting diode (OLED) including an anode electrode 80, an organic light emitting layer 84, and a cathode electrode 86. The anode electrode 80 may be connected to the drain electrode of the second TFT T2 and the cathode electrode 86 may be connected to the ground voltage ELVSS.

The anode electrode 80 may be connected to the drain electrode 60*b* of the TFT T through a via hole of a planarizing layer 70 formed in an upper part of the TFT T. The organic light emitting layer 84 may be formed on the anode electrode 80 of a light emitting region (an aperture) exposed by a pixel defining layer 82, and the cathode electrode 86 may be formed on the organic light emitting layer 84.

As described above, when the semiconductor device according to the present embodiment is used, the storage capacitor Cst is integrated with the TFT T. Accordingly, it may not be necessary to additionally form a separate storage capacitor. Therefore, it may be possible to reduce the area occupied by the storage capacitor Cst and to increase the aperture rapture of the LED, that is, to increase the size of the light emitting region. Accordingly, it may be possible to easily realize a highly integrated and high picture quality FPD.

In order to secure a high electrostatic capacitance of the storage capacitor Cst, it is advantageous to form the second TFT T2 that operates as the driving element rather than the first TFT T1 that operates as the switching element by the semiconductor device to include a capacitor according to the present embodiment. The size (width and length) of the driving element having current driving ability may be larger than that of the switching element. Accordingly, it may be possible to secure a high electrostatic capacitance for the storage capacitor Cst.

In addition, it may be possible to maximize an effect when a plurality of TFTs are serially connected to each other and are connected to each other in parallel due to leakage current or when the TFTs are formed to have a multiple gate structure.

Figure 4A:
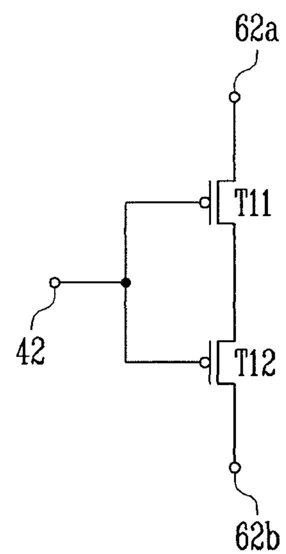
FIGS. 4A, 5A, and 6A are circuit diagrams illustrating another embodiment of the FPD.
Figure 4B:
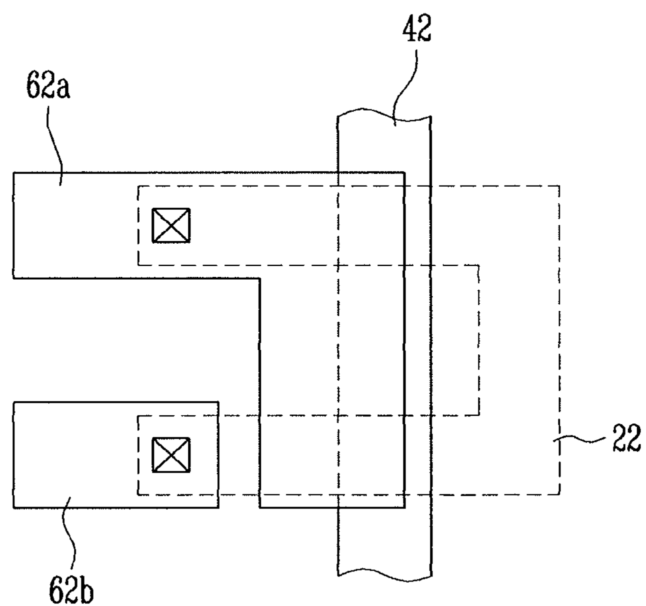
FIGS. 4B, 5B, and 6B are layout diagrams illustrating the embodiments of FIGS. 4A, 5A, and 6A.

FIG. 4A illustrates a structure in which TFTs T11 and T12 are serially connected to each other. As illustrated in FIG. 4B, an area in which a source electrode 62*a* and a gate electrode 42 overlap each other may be increased in comparison with the structure of FIG. 1. Accordingly, it may be possible to secure a high electrostatic capacitance for the storage capacitor Cst. In FIG. 4B, reference numeral 22 denotes a semiconductor layer.

Figure 5A:
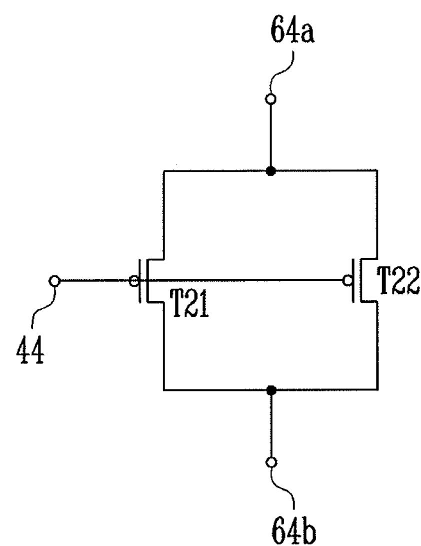
Figure 5B:
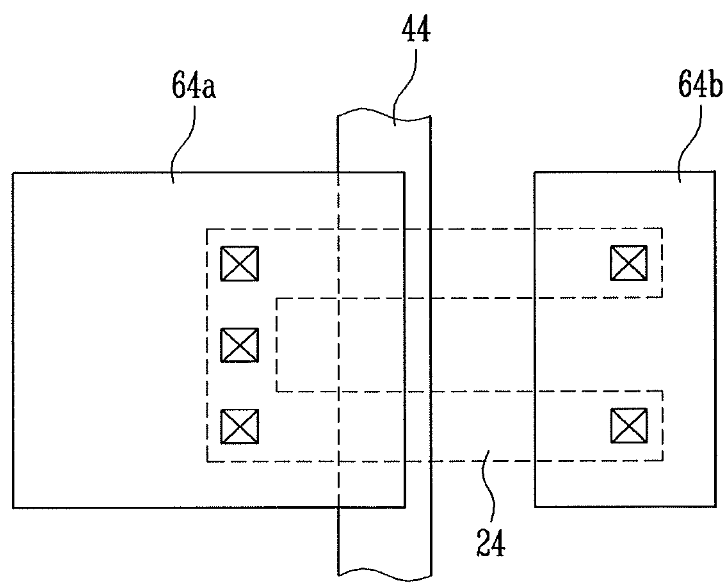

FIG. 5A illustrates a structure in which TFTs T21 and T22 are connected to each other in parallel. As illustrated in FIG. 5B, an area in which a source electrode 64*a* and a gate electrode 44 overlap each other may be increased in comparison with the structure of FIG. 1. Accordingly, it may be possible to secure a high electrostatic capacitance for the storage capacitor Cst. In FIG. 5B, reference numeral 24 denotes a semiconductor layer.

Figure 6A:
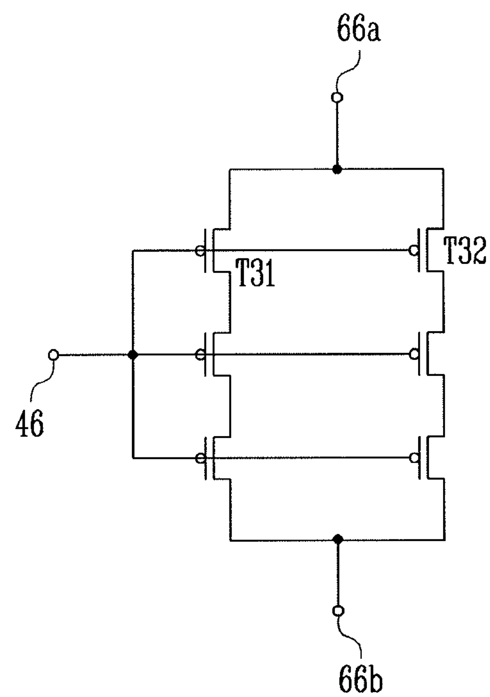
Figure 6B:
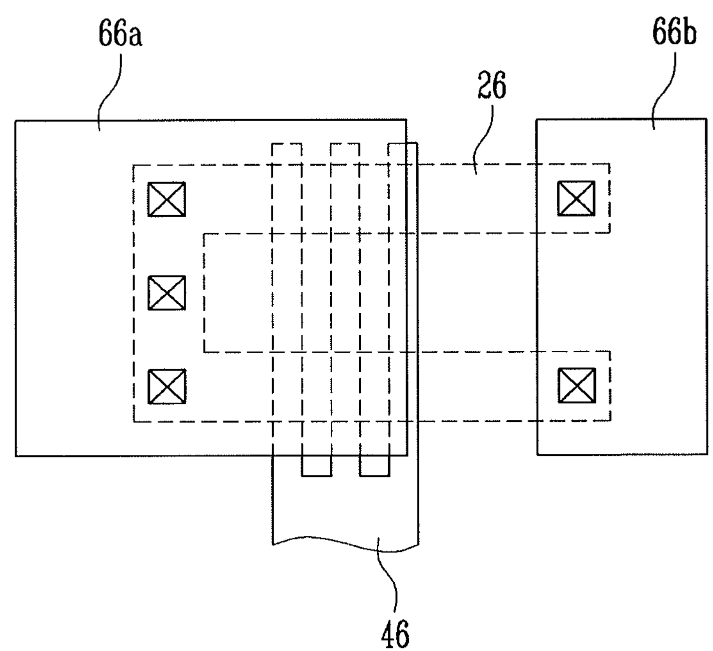

FIG. 6A illustrates a structure in which TFTs T31 and T32 having a multiple gate structure are connected to each other in parallel in order to increase an on-current. As illustrated in FIG. 6B, the area in which a source electrode 66*a* and a gate electrode 46 overlap each other is increased in comparison with the structure of FIG. 5B. Accordingly, it may be possible to secure a high electrostatic capacitance for the storage capacitor Cst. In FIG. 6B, reference numeral 26 denotes a semiconductor layer.

In the above embodiment, the capacitor Cst built into the TFT T is described. In another implementation, in order to increase the electrostatic capacitance, another capacitor (not shown) may be additionally formed to be adjacent to the capacitor Cst and may be connected to the capacitor Cst in parallel.

By way of summation and review, in a semiconductor device, the TFT and the capacitor may be formed in different positions. In order to increase current driving capability and electrostatic capacitance, an increase in the size of the semiconductor device may be unavoidable, which may prevent the semiconductor device from being highly integrated.

Furthermore, in a FPD such as a liquid crystal display (LCD) or an organic light emitting display, it is desirable to secure brightness at a uniform level. Therefore, the electrostatic capacitance of the capacitor of a uniform level is desired. When the size of the capacitor is increased in order to increase the electrostatic capacitance, the size (aperture ratio) of a light emitting region may be reduced. Accordingly, it may be difficult to realize a high resolution, and the life of the FPD may be reduced.

In contrast, the embodiments may provide a semiconductor device having a reduced size so that the semiconductor device is highly integrated. An area occupied by a capacitor may be minimized. A flat panel display with an improved aperture ratio of a light emitting element may be provided by reducing the size of the semiconductor device.

In more detail, in the semiconductor device according to the embodiments, the TFT and the capacitor are integrated with each other. The structure of the TFT is partially changed and the capacitor is built into the TFT so that the size of the semiconductor device may be reduced by the area occupied by the capacitor, and manufacturing processes are simplified. When a semiconductor device according to the embodiments is applied to an FPD, it may be possible to provide a large size of the light emitting region in comparison to provide a high resolution and increase the life of the FPD.

While the embodiments have been described in connection with certain exemplary embodiments, it is to be understood that the disclosed embodiments are not limited, but are intended to cover various modifications and equivalent arrangements included within the spirit and scope of the appended claims, and equivalents thereof.

What is claimed is:

1. A semiconductor device, comprising:
a U-shaped semiconductor layer on a substrate;
a gate electrode electrically insulated from the semiconductor layer by a gate insulating layer;
an insulating layer on the gate insulating layer and on the gate electrode; and
a source electrode and a drain electrode on the insulating layer, the source and drain electrode being connected to the semiconductor layer, the semiconductor layer, the gate electrode, the source electrode, and the drain electrode being configured to provide a plurality of thin film transistors connected in series or in parallel, the gate electrode being a common gate electrode to the plurality of thin film transistors, and the source electrode overlapping at least a part of the common gate electrode in each of the plurality of thin film transistors, wherein the source electrode, the insulating layer, and the common gate electrode overlap each other so as to provide a capacitor integrated with the thin film transistors,
wherein:
the U-shaped semiconductor layer comprises two legs with free ends,
one of the free ends is interconnected with the drain electrode by one contact hole, and
another one of the free ends is interconnected with the drain electrode by one contact hole and a base section of the semiconductor layer is contacted to the source electrode by three contact holes.

2. The semiconductor device as claimed in claim 1, wherein:
the insulating layer includes contact holes that expose the semiconductor layer, and
the source and drain electrodes are connected to the semiconductor layer through the contact holes.

3. A flat panel display (FPD), comprising:
a first thin film transistor (TFT) connected to a scan line and a data line;
a second TFT connected to the first TFT, the second TFT being configured as a plurality of second TFTs connected in series or in parallel; and
a light emitting element connected to the second TFT,
wherein the second TFT includes:
a U-shaped semiconductor layer on a substrate;
a gate electrode electrically insulated from the semiconductor layer by a gate insulating layer, the gate electrode being a common gate electrode to the plurality of second TFTs;
an insulating layer on the gate insulating layer and on the gate electrode; and
a source electrode and a drain electrode on the insulating layer, the source electrode and the drain electrode being connected to the semiconductor layer, and the source electrode overlapping at least a part of the common gate electrode, wherein the source electrode, the insulating layer, and the common gate electrode overlap each other so as to provide a capacitor integrated with the second TFT,
wherein:
the U-shaped semiconductor layer comprises two legs with free ends,
one of the free ends is interconnected with the drain electrode by one contact hole, and
another one of the free ends is interconnected with the drain electrode by one contact hole and a base section of the semiconductor layer is contacted to the source electrode by three contact holes.

4. The FPD as claimed in claim 3, wherein:
the insulating layer includes contact holes that expose the semiconductor layer, and
the source and drain electrodes are connected to the semiconductor layer through the contact holes.

5. The FPD as claimed in claim 3, wherein:
the source electrode of the second TFT is connected to a power source voltage, and
the drain electrode of the second TFT is connected to the light emitting element.

6. The FPD as claimed in claim 5, wherein:
the light emitting element includes an anode electrode, an organic light emitting layer, and a cathode electrode, and
the anode electrode is connected to the drain electrode of the second TFT.

7. A flat panel display (FPD), comprising:
a first thin film transistor (TFT) connected to a scan line and a data line;
a second TFT connected to the first TFT, the second TFT being configured as a plurality of second TFTs connected in series or in parallel; and
a light emitting element connected to the second TFT,
wherein the second TFT includes:
a U-shaped semiconductor layer on a substrate;
a gate electrode electrically insulated from the semiconductor layer by a gate insulating layer, the gate electrode being a common gate electrode to the plurality of second TFTs;
an insulating layer on the gate insulating layer and on the gate electrode; and
a source electrode and a drain electrode on the insulating layer, the source electrode and the drain electrode being connected to the semiconductor layer, and the source electrode overlapping at least a part of the common gate electrode, wherein the source electrode, the insulating layer, and the common gate electrode overlap each other so as to provide a capacitor integrated with the second TFT, wherein:

the source electrode of the second TFT is connected to a power source voltage, the drain electrode of the second TFT is connected to the light emitting element, the light emitting element includes an anode electrode, an organic light emitting layer, and a cathode electrode, the anode electrode is connected to the drain electrode of the second TFT, the FPD further includes a pixel defining layer including an aperture, the organic light emitting layer is on the anode electrode and in the aperture of the pixel defining layer, and the cathode electrode is on the organic light emitting layer.

* * * * *